United States Patent
Jackson et al.

[11] Patent Number: 5,098,859
[45] Date of Patent: Mar. 24, 1992

[54] METHOD FOR FORMING DISTRIBUTED BARRIER COMPOUND SEMICONDUCTOR CONTACTS

[75] Inventors: Thomas N. Jackson, Peekskill; Masanori Murakami, Goldens Bridge; William H. Price, East Rockaway; Sandip Tiwari, Ossining; Jerry M. Woodall, Bedford Hills; Steven L. Wright, Yorktown Heights, all of N.Y.

[73] Assignee: International Business Machines Corporation, Armonk, N.Y.

[21] Appl. No.: 252,634

[22] Filed: Oct. 3, 1988

Related U.S. Application Data

[63] Continuation of Ser. No. 183,473, Apr. 15, 1988, abandoned, which is a continuation of Ser. No. 876,063, Jun. 19, 1986, abandoned.

[51] Int. Cl.$^5$ .................... H01L 21/44; H01L 21/48
[52] U.S. Cl. .................... 437/184; 437/189; 437/190; 437/202; 437/247; 357/67; 357/71
[58] Field of Search ............... 437/184, 189, 190, 202, 437/247; 357/5, 16, 67, 71

[56] References Cited

U.S. PATENT DOCUMENTS

| | | | |
|---|---|---|---|
| 4,398,963 | 8/1983 | Stall et al. | 437/184 |
| 4,558,336 | 12/1985 | Chang et al. | 357/88 |
| 4,583,110 | 4/1986 | Jackson et al. | 437/22 |
| 4,794,444 | 12/1988 | Liu et al. | 357/16 |

Primary Examiner—Brian E. Hearn
Assistant Examiner—Tuan Nguyen
Attorney, Agent, or Firm—Thomas J. Kilgannon; Blaney B. Harper

[57] ABSTRACT

The control of barriers to carrier flow in a contact between a metal and a higher band gap semiconductor employing an intermediate lower band gap semiconductor with doping and greater than 1.5% lattice mismatch. A WSi metal contact of doped InAs on GaAs of $7 \times 10^{-6}$ ohm/cm$^2$ is provided.

5 Claims, 1 Drawing Sheet

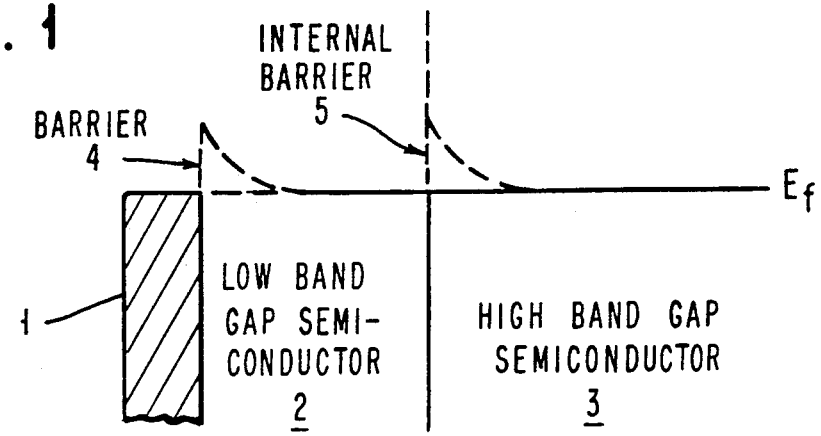
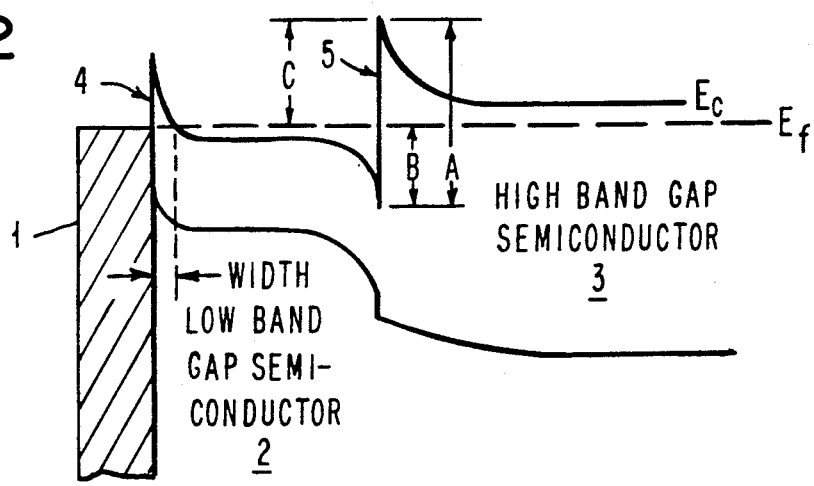
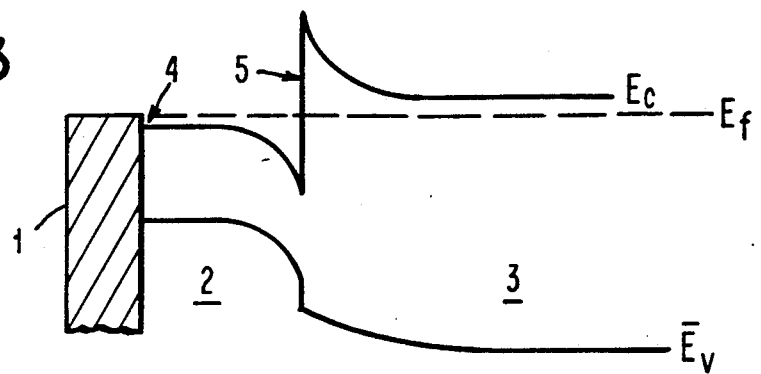

METHOD FOR FORMING DISTRIBUTED BARRIER COMPOUND SEMICONDUCTOR CONTACTS

This is a continuation application of pending prior application Ser. No. 183,473, filed on Apr. 15, 1988 now abandoned which is a continuation of Ser. No. 876,063, filed on June 14, 1986, now abandoned.

TECHNICAL FIELD

The technical field of the invention is that of contacts to compound semiconductor materials. Simple metal external contacts to the wider band gap compound semiconductors exhibit barriers to current flow that are inherent in the device physics.

BACKGROUND ART

It has been recognized in the art that one solution to the barrier problem would be to place, between the metal and the wider band gap compound semiconductor, an intermediate smaller band gap semiconductor.

An early illustration of this is in U.S. Pat. No. 3,984,261 wherein a layer of indium gallium arsenide was employed as a contact to gallium arsenide (GaAs) along with alloying.

Further, in Electronics Letters 15, 24, 1979, p.800, a contact to GaAs is described having a lower band gap material where that lower band gap material Ge is grown on the GaAs. The Ge-GaAs lattices are closely matched. Low impedance is achieved by heavy doping and the fact that Ge is a dopant for GaAs. However, Ge as a low barrier semiconductor has a relatively large density of states in the conduction band.

A major advantage of the use of InAs as the intermediate low band gap material is that there is no significant barrier between the InAs and an external metal but as the art further developed, it became apparent that there was more than one barrier in series to be considered when a metal contact was made to a wider band gap semiconductor through an intermediate lower band gap semiconductor and that the barrier at the lower band gap/higher band gap interface for the material InAs would be a problem. A description of the barrier and a proposed solution by employing a graded band gap region is reported in J. Vac. Sci. Technol., 19 3, Sept./Oct. 1981, p.626; and a survey of the metal contact and interface problems where an intermediate lower band gap semiconductor region is used is reported in J. Vac. Sci. Technol., 19 3, Sept./Oct. 1981, p.794.

In Physical Review Letters, Vol. 51, No. 19, 7 Nov. 1983, p.1783, experimental further studies of the internal barrier reported that misfit disclocations in a planar array at an internal interface between GaInAs and GaAs were responsible for the barrier at higher band gap semiconductor interfaces.

It is becoming clear in the art that more than one barrier is involved where a low band gap semiconductor intermediate region between the metal and the higher band gap semiconductor is employed, that each can affect the overall performance of the contact and that each requires different considerations.

BRIEF DESCRIPTION OF THE DRAWINGS

FIG. 1 is an illustration of the barriers encountered by a carrier in the contact of the invention.

FIG. 2 is an energy band diagram across the interfaces of the contact of the invention illustrating the interplay between the conditions and its effect on contact performance.

FIG. 3 is an energy band diagram illustrating a zero metal/low band gap semiconductor barrier.

DISCLOSURE OF THE INVENTION

The invention is an improvement in the type of external metal contact to a higher band gap compound semiconductor material wherein a low band gap intermediate semiconductor material is inserted between the metal and the higher band gap semiconductor material and the materials and doping are selected such that the barriers at the metal/low band gap semiconductor and at the low band gap/high band gap semiconductor in combination do not increase the detrimental aspects to the device performance.

In accordance with the invention, a small barrier is tolerable in not being seriously detrimental to device performance so that the contact is provided with a plurality of low tolerable barriers in series with respect to carrier flow.

The barrier at the metal/low band gap semiconductor material interface is selected by material and doping considerations not to exceed the tolerable barrier level.

The barrier at the low band gap/higher band gap semiconductor interface is caused to be effectively low by combined features in the low band gap semiconductor and properties of that interface.

Low band gap materials, such as InSb, InAs and InGaAs having band gaps in the 0.5 V range or less, have a low density of states in the conduction band which allows the Fermi level to be moved by small changes in doping over a wide range in that conduction band.

In accordance with the invention, the low band gap semiconductor must have a greater than 1.5% lattice mismatch with the high band gap semiconductor and the low band gap semiconductor must be heavily doped. These features together with a low density of interface states operate to produce conditions at the low band gap/high band gap semiconductor interface that results in a lower effective barrier that is in the range that is tolerable in device performance.

Further, in accordance with the invention, the distributed series of barriers in probability of carrier flow operate as a barrier only as great as the highest one and an overall lower effective barrier for the contact is achieved.

Further, the heavy doping in the low band gap semiconductor region may also operate to produce a tunneling condition in at least a portion of the metal/low band gap semiconductor barrier thereby effectively lowering that barrier.

Referring to FIG. 1, a diagram is provided illustrating the distributed series of low barriers to carrier flow.

In FIG. 1, the metal 1 is the external contact. A low band gap semiconductor 2 is positioned between the metal 1 and the higher band gap semiconductor 3. For many low band gap semiconductor materials 2 and metals 1, there will be a barrier 4. The materials are selected so that this barrier is tolerable in device performance.

At the interface between the low band gap semiconductor 2 and the high band gap semiconductor 3, there is a second internal barrier 5.

In accordance with the invention, limitations are placed on the low band gap semiconductor that cooperate to lower the effective barriers 4 and 5 and the combined effective lower barriers because of the probability considerations in semiconductor carrier flow is no greater than the highest single barrier with respect to that carrier flow. The result is an improved metal/low band gap/high band gap contact with greater materials and processing flexibility.

Referring next to FIG. 2, a sketch of a band energy diagram is provided illustrating the conditions in the contact of the invention. The low band gap semiconductor has a mismatch with the crystal lattice of the higher band gap semiconductor by greater than 1.5%. Further, it is doped such that the Fermi level is positioned in the conduction band, effectively reducing the internal interface barrier. This doping is usually of the order of $10^{17}$ impurity atoms/cc.

These limitations produce the interrelated effects of lowering the effective barriers both at the metal/low band gap semiconductor interface and at the low band gap/high band gap semiconductor interface.

Considering first the requirement that there be a greater than 1.5% lattice mismatch between the low band gap and high band gap semiconductors.

In accordance with the invention, a large, greater than 1.5% lattice mismatch is found to produce several interrelated beneficial effects.

A first is that the large mismatch results in carrier traps due to unsatisfied bonds being spread over three dimensions at the interface and this in turn produces a $10^7$ reduction in carrier traps at a particular atomic interface, such as had been encountered where lattices were closer to being matched and all misfit dislocations were in a grid in a narrow interface.

Another is that the greater than 1.5% mismatch also introduces some crystal strain which operates to reduce the conduction band difference between the low band gap and high band gap regions operates to assist in the lowering of the internal barrier.

Still another is that doping is employed in the low band gap region. The doping operates both to contribute to the lowering of the effective internal barrier at the low band gap/high band gap interface and may provide a tunneling type condition in at least a portion of the barrier at the metal/low band gap semiconductor interface.

In addition, the internal barrier may also be lowered by an annealing temperature cycle which will reduce the conduction band offset between the high and low band gap materials.

The structure of the invention is an external contact achieved in three layers—a metal, a low band gap semiconductor and a higher band gap semiconductor, where any barrier between the metal and the low band gap semiconductor is made effectively lower than it would inherently be by the doping in the low band gap semiconductor, and the barrier at the internal interface between the low band gap semiconductor and the high band gap semiconductor is made effectively lower by the effect of doping in the low band gap semiconductor. The effective barrier at the internal interface is also lowered by the fact that the greater than 1.5% lattice mismatch between the low band gap semiconductor and the higher band gap semiconductor is sufficiently large to insure three-dimensional growth thereby reducing carrier traps, the resulting crystal strain contributes to lowering the barrier between the low band gap semiconductor and the higher band gap semiconductor and the doping in the lower band gap semiconductor also contributes to lowering that internal barrier.

An anneal temperature cycle may be used to further lower the effective internal barrier.

Under these conditions, carrier flow between the metal and the high band gap semiconductor will encounter a series of lower effective barriers, only the highest of which affects performance.

The effect of the improved contact of the invention may be described in comparison with the standard Schottky relationship for a metal contact semiconductor interface as set forth in Equation 1.

$$\Phi_{bn} = E_c - E_f \tag{1}$$

where $\Phi_{bn}$ is the barrier on, for example, n conductivity type material,
$E_c$ is the conduction band energy, and
$E_f$ is the Fermi energy at the interface.

In a material such as the extensively studied GaAs, the barrier $\Phi_{bn}$ in Equation 1 is of the order of 0.8 electron volts (eV), which is so high as to seriously interfere with device performance.

In practice, while no barrier would be ideal, a barrier of up to 0.5 eV is considered tolerable.

In contrast to the situation of Equation 1, in accordance with the invention, the barrier to carrier flow is the greater of the barrier 4 or the barrier 5 in FIG. 1. Assuming, referring to FIG. 2, the material of the semiconductor 2 is such that there is a low or no barrier at the interface with the metal 1 or that the doping in semiconductor 2 is sufficient to produce a barrier 4 width W sufficient for tunneling under conditions well known in the art so that the barrier 4 is within the tolerable value and is the lower of the two barriers 4 and 5, then under these conditions, the barrier 5 will be the barrier that affects contact performance and can be expressed as in Equation 2.

$$\Phi_{5n} = (\Delta E_c) - (E_f - E_{c1}) \tag{2}$$

where $\Phi_{5n}$ is the barrier assuming n conductivity type material
$\Delta E_c$ is the total conduction band offset labelled A in FIG. 2,
$E_f$ is the Fermi energy level
$E_{c1}$ is the conductition band edge at the low band gap side of the internal interface.

In Equation 2, it will be seen that the quantity $(E_f - E_{c1})$ is subtracted from the conduction band offset $\Delta E_c$ and operates to provide a lower effective barrier 5.

This is illustrated in accordance with the invention referring to FIG. 2 by $\Delta E_c$, the total conduction band offset being labelled A, B is the label for the quantity $(E_f - E_c)$, the difference between the Fermi level and the position of the conduction band of the low band gap material as determined by the doping and C is the label for the effective barrier 5.

In accordance with the invention, the requirement for heavy doping in the semiconductor 2 operates to pull the conduction band edge of semiconductor 2 away from the Fermi level, thereby increasing B, and this, in turn, operates to reduce the effective barrier C.

Further, in accordance with the invention, the strain due to the greater than 1.5% lattice mismatch also operates to contribute to a lower effective barrier by reducing A and an anneal temperature cycle operates to further reduce this barrier.

Thus, in accordance with the invention, the combination of requirements on the low band gap semiconductor 2 that there be a greater than 1.5% lattice mismatch with respect to the high band gap semiconductor 3 coupled with the $10^{17}$ doping requirement in the low band gap semiconductor 2 in combination operate to produce lower effective barriers in series of which only the higher one affects device performance.

It will be apparent in the light of the principles set forth that through the selection of materials, doping and lattice mismatch as many barriers, and at what height, may be employed to meet material and processing considerations yet only the highest barrier controls the overall contact electrical performance.

Although the parameters of particular materials and dopants are well tabulated in the literature of the art, the following exemplary illustrations are set forth to provide a starting place for one skilled in the art.

EXAMPLE 1

| Metal 1 | Au | | |
|---|---|---|---|
| Semiconductor 2 | $In_{0.5}Ga_{0.5}As$ | Energy gap width | .75 eV |
| | | Lattice spacing | 5.87 |
| Semiconductor 3 | GaP | Energy gap width | 2.26 eV |
| | | Lattice spacing | 5.45 |

Doping - $1 \times 10^{19}$ atoms/cc with Si.
Lattice mismatch 5.87-5.45/5.87 = 7%
Barrier 4 $\approx$ 0.3 eV
Barrier 5 $\approx$ 0.5 eV

EXAMPLE 2

| Metal 1 | Al | | |
|---|---|---|---|
| Semiconductor 2 | InSb | Energy gap width | .18 eV |
| | | Lattice spacing | 6.48 |
| Semiconductor 3 | GaSb | Energy gap width | .72 eV |
| | | Lattice spacing | 6.10 |

Doping - $1 \times 10^{18}$ atoms/cc with Se
Lattice mismatch = 6%
Barrier 4 = 0 eV
Barrier 5 = 0.4 eV

EXAMPLE 3

| Metal 1 | WSi | | |
|---|---|---|---|
| Semiconductor 2 | InAs | Energy gap width | .35 eV |
| | | Lattice spacing | 6.06 |
| Semiconductor 3 | GaAs | Energy gap width | 1.44 eV |
| | | Lattice spacing | 5.65 |

Doping - $1 \times 10^{20}$ atoms/cc with Si
Lattice mismatch = 7%
Barrier 4 = 0 eV
Barrier 5 = 0.30 eV

BEST MODE FOR CARRYING OUT THE INVENTION

The material InAs has two properties that are favorable for the invention. The first is that the conduction band at a metal interface is below the Fermi level so that barrier 4 is not present and the second is that in polycrystalline InAs the conduction band is below the Fermi level at the grain boundaries so that the low band gap semiconductor 2 need not be monocrystalline.

The preferred mode for carrying out the invention would be to employ InAs material as the low band gap semiconductor 2 with the extensively studied n-type GaAs as the higher band gap semiconductor 3.

The structure, referring to FIG. 3, would consist of a heavily doped n+ layer of InAs 2, 200 to 300Å thick, using silicon or selenium as the dopant. Where silicon is employed, the doping preferably exceeds $6 \times 10^{18}$ atoms/cc whereas with selenium a dopant concentration may be $8 \times 10^{20}$ atoms/cc or higher.

The GaAs layer 3 is typically doped between $1 \times 10^{17}$ and $5 \times 10^{18}$ atoms/cc and is 1000 to 3000 Angstroms thick on a suitable substrate, such as semi-insulating GaAs.

The metal contact 1 is tungsten silicide although the metal is not critical and any metal will make a good contact.

The structure is formed by depositing or growing the doped InAs in either mono or poly crystalline form on the GaAs.

The structure is annealed at temperatures between 850° and 1000° C. for a typical time range of 20 seconds to 1 minute. At higher annealing temperatures, the doping in semiconductor 1 operates to further improve the low effective barrier 5 conditions at the internal interface.

The resulting contact structure provides a contact with a specific resistance of $7 \times 10^{-6}$ ohm centimeters$^2$ or lower.

What has been described is a principle for controlling the effective barrier to carrier flow between a metal and a higher band gap semiconductor employing an intermediate lower band gap semiconductor with doping and >1.5% lattice mismatch into the lower band gap semiconductor which operates to produce a series of lower effective barriers, only the highest of which is significant to carrier flow.

Having thus described our invention, what we claim as new and desire to secure by Letters Patent is:

1. In a method of making a metal contact to a higher band gap compound semiconductor material wherein a lower band gap compound semiconductor region is interposed between said metal and said higher band gap semiconductor material, the improvement comprising:
    placing a quantity of a lower band gap compound semiconductor material having a lattice spacing difference greater than 1.5% with respect to said higher band gap compound semiconductor material and having a doping level greater than $10^{17}$ atoms/cc in contact with said higher band gap compound semiconductor material to lower the effective internal barrier, and
    annealing for a time and at a temperature sufficient to further lower the effective internal barrier.

2. The method of claim 1 wherein said lower band gap compound semiconductor material is $In_yGa_{1-y}As$ with y equal to or larger than 0.5 and said higher band gap compound semiconductor material is GaP.

3. The method of claim 1 wherein said lower band gap compound semiconductor material is InSb and said higher band gap compound semiconductor material is GaSb.

4. The method of claim 1 wherein said lower band gap compound semiconductor material is InAs and said higher band gap compound semiconductor material is GaAs.

5. The method of claim 4 wherein said InAs is doped with an element from the group of Si and Se and said annealing temperature is in the range between 850° C. and 1000° C. and said time is in the range of 20 seconds to 1 minute.

* * * * *